US010002810B2

(12) United States Patent
Jenkins et al.

(10) Patent No.: US 10,002,810 B2
(45) Date of Patent: Jun. 19, 2018

(54) ON-CHIP COMBINED HOT CARRIER INJECTION AND BIAS TEMPERATURE INSTABILITY MONITOR

(71) Applicant: INTERNATIONAL BUSINESS MACHINES CORPORATION, Armonk, NY (US)

(72) Inventors: Keith A. Jenkins, Sleepy Hollow, NY (US); Barry Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 294 days.

(21) Appl. No.: 14/750,748

(22) Filed: Jun. 25, 2015

(65) Prior Publication Data

US 2016/0377672 A1  Dec. 29, 2016

(51) Int. Cl.
*G01R 31/26* (2014.01)
*G01R 31/28* (2006.01)
*H01L 21/66* (2006.01)

(52) U.S. Cl.
CPC .......... *H01L 22/34* (2013.01); *G01R 31/2884* (2013.01); *G01R 31/2642* (2013.01)

(58) Field of Classification Search
CPC ............ G01R 31/2884; G01R 31/2648; G01R 31/2879; G01R 31/3004; G01R 31/31715; G01R 31/31701; G01R 31/2642; G01R 31/26; G01R 31/28; H01L 22/34
See application file for complete search history.

(56) References Cited

U.S. PATENT DOCUMENTS

| 6,903,564 | B1 * | 6/2005 | Suzuki | G11C 29/028 324/762.02 |
| 8,692,571 | B2 | 4/2014 | Lai et al. | |
| 8,779,787 | B2 | 7/2014 | Laplanche | |
| 2006/0223201 | A1 * | 10/2006 | Liu | G01R 31/2642 438/10 |
| 2009/0278564 | A1 * | 11/2009 | Dehon | G06F 17/5054 326/9 |
| 2011/0090015 | A1 * | 4/2011 | Sumita | H03K 3/0315 331/56 |

(Continued)

OTHER PUBLICATIONS

J. Keane et al., "An all-in-one silicon odometer for separately monitoring HCI, BTI, and TDDB," IEEE Journal of Solid-State Circuits, vol. 45, No. 4, Apr. 2010, pp. 817-829.

(Continued)

*Primary Examiner* — Jermele M Hollington
*Assistant Examiner* — Suresh K Rajaputra
(74) *Attorney, Agent, or Firm* — Tutunjian & Bitetto, P.C.; Vazken Alexanian (57) ABSTRACT

Methods and circuits for monitoring circuit degradation include measuring degradation in a plurality of on-chip test oscillators that vary according to a quantity that influences hot carrier injection (HCI) degradation. The measured degradation for the plurality of test oscillators is extrapolated to determine a bias temperature instability (BTI) contribution to the measured degradation. The BTI contribution is subtracted from the measured degradation at a predetermined value of the quantity to determine the HCI degradation for devices represented by the predetermined value.

20 Claims, 8 Drawing Sheets

(56) References Cited

U.S. PATENT DOCUMENTS

| | | | |
|---|---|---|---|
| 2012/0161885 A1* | 6/2012 | Saneyoshi | G01R 31/2856 331/55 |
| 2013/0015876 A1* | 1/2013 | Lai | G01R 31/2642 324/762.01 |
| 2014/0095138 A1 | 4/2014 | Weir et al. | |
| 2014/0176116 A1 | 6/2014 | Kumar et al. | |
| 2014/0218060 A1* | 8/2014 | Saneyoshi | G01R 31/3187 324/750.3 |
| 2014/0225639 A1 | 8/2014 | Guo et al. | |
| 2014/0306687 A1* | 10/2014 | Ahmadi | G01R 31/31727 324/76.11 |
| 2015/0061726 A1* | 3/2015 | Kawa | G01R 31/2621 324/762.09 |

OTHER PUBLICATIONS

P.-F. Lu and K. A. Jenkins, "A built-in BTI monitor for long-term data collection in IBM microprocessors," IEEE International Reliability Physics Symposium (IRPS), Apr. 14-18, 2013, 4A, 6 pages.
T. Matsuda et al., "Reliability analysis of NAND gates with modified channel length in series n-MOSFETs," IEEE International Conference on Microelectronic Test Structures (ICMTS), Mar. 19-22, 2012, 4 pages.
N. Bidokhti et al., "Life after failure," Annual Reliability and Maintainability Symposium (RAMS), Jan. 27-30, 2014, 7 pages.

* cited by examiner

FIG. 1

(Prior art)

ON-CHIP COMBINED HOT CARRIER INJECTION AND BIAS TEMPERATURE INSTABILITY MONITOR

BACKGROUND

Technical Field

The present invention relates to monitoring circuit degradation and, more particularly, to degradation sensors that monitor both hot carrier injection degradation and bias-temperature instability degradation of semiconductor devices and structures.

Description of the Related Art

There are several physical mechanisms that cause complementary metal-oxide semiconductor (CMOS) field effect transistor (FET) degradation over time. As the circuit composed of CMOS FETs ages and is used, these degradation mechanisms can cause important characteristics of the circuit (such as, e.g., threshold voltage) to shift or can eventually cause catastrophic failure of the circuit.

One mechanism of degradation is bias-temperature instability (BTI). BTI produces increases in the threshold voltage of a semiconductor device and reduces the drain current of the device. The progression of BTI degradation is determined by total power-on time of the device and is a result of charge carriers tunneling through barriers and damaging the material along interfaces. A second degradation mechanism is hot carrier injection (HCI). In contrast, HCI degradation typically occurs when the device switches states. HCI is caused by "hot" electrons that have enough energy to become trapped in the gate dielectric or to create interface traps. In both cases, BTI and HCI cause physical damage to the device, degrade the properties of the device, such that the circuit may eventually fail.

Figure 1:
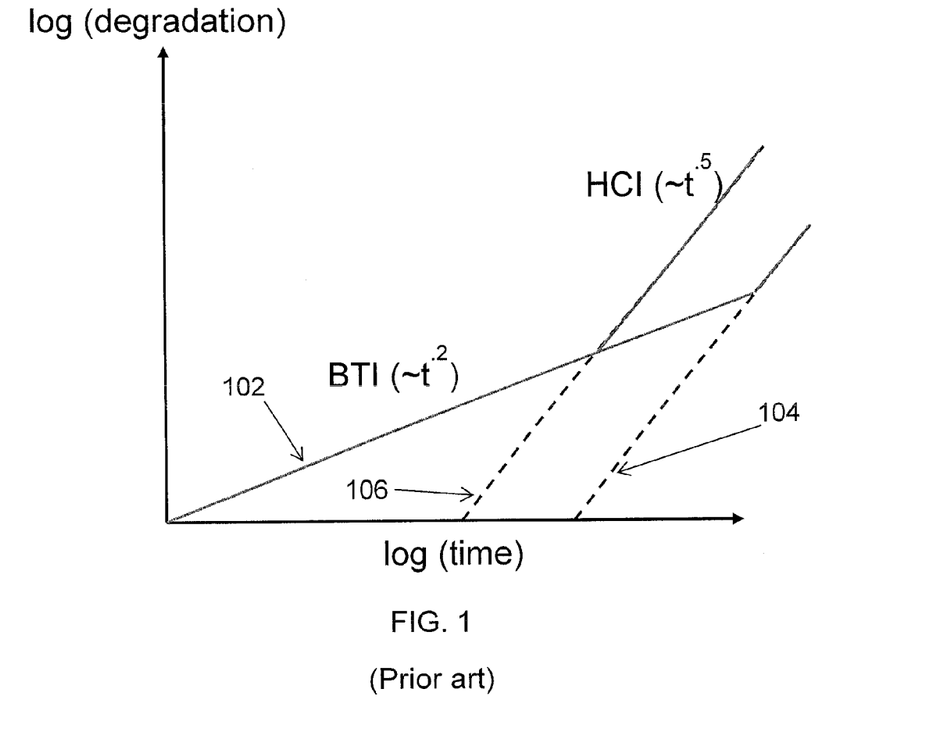
FIG. 1 is a diagram of hot carrier injection (HCI) and bias temperature instability (BTI) degradation in circuits.

Referring now to FIG. 1, a comparison between the progression of BTI and HCI degradation is shown. The vertical axis represents the logarithm of the degradation that has accumulated, while the horizontal axis is the logarithm of the time elapsed. The BTI curve has a rough time dependence of about $t^{0.2}$, while the HCI curve 104 has a time dependence of about $t^{0.5}$. HCI is a more dramatic cause of degradation at longer time spans. As shown in FIG. 1, the curve 106 becomes the dominant component of the degradation after a certain point in time.

However, existing on-chip degradation monitors are largely insensitive to HCI degradation. As a result, they may not detect degradation due to HCI effects until after other parts of the circuit have already undergone significant degradation or failure. As a result, such monitors are not able to detect the rapid aging that occurs at long timespans.

SUMMARY

A method for monitoring circuit degradation includes measuring degradation in a plurality of on-chip test oscillators that vary according to a quantity that influences hot carrier injection (HCI) degradation. The measured degradation for the plurality of test oscillators is extrapolated to determine a bias temperature instability (BTI) contribution to the measured degradation. The BTI contribution is subtracted from the measured degradation at a predetermined value of the quantity to determine the HCI degradation for devices represented by the predetermined value.

A system for monitoring circuit degradation includes a counter module configured to collect timing information from a plurality of on-chip test oscillators that vary according to a quantity that influences hot carrier injection (HCI) degradation. A fit module is configured to determine a measurement of degradation for each test oscillator based on the timing information, to extrapolate from the measured degradation for the plurality of test oscillators to determine a bias temperature instability (BTI) contribution to the measured degradation, and to subtract the BTI contribution from the measured degradation at a predetermined value of the quantity to determine the HCI degradation for devices represented by the predetermined value.

An on-chip test circuit includes a reference oscillator that is powered on only during tests. A plurality of test oscillators vary according to a quantity that influences hot carrier injection (HCI) degradation. A reference counter provides timing information for the reference oscillator. A plurality of test counters each provide timing information for a respective test ring oscillator.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present principles provide on-chip degradation monitors that use multiple ring oscillators and on-chip frequency measurement to measure degradation of both bias temperature instability (BTI) and hot carrier injection (HCI). The on-chip degradation monitors separate the effects of BTI and HCI by using a variety of ring oscillators having different sensitivities, including frequency, capacitive load, and channel length. Because BTI and HCI operate by different mechanisms and have different dependencies on, e.g., time and frequency, multiple ring oscillators having different properties are compared to one another to determine relative levels of degradation caused by BTI and HCI. These different measurements are analyzed according to known relationships between BTI and HCI as discussed below to extract degradation estimates due to both mechanisms.

Figure 2:
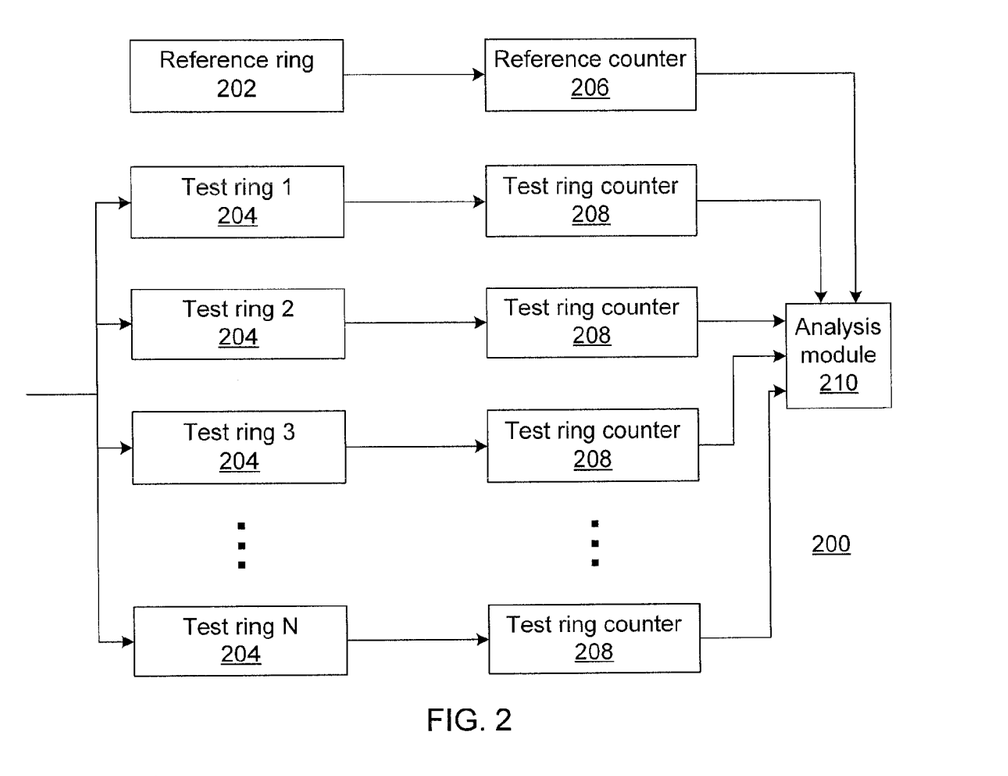
FIG. 2 is a block diagram of an on-chip monitoring circuit in accordance with the present principles.

Referring now to the drawings in which like numerals represent the same or similar elements and initially to FIG. 2, an exemplary on-chip monitor 200 is shown. The monitor makes use of ring oscillators—configured as a series of devices where the output of a last device is provided to the first device as input. Ring oscillators provide a vehicle for testing the degradation of semiconductor devices, as they have measurable properties that degrade with use according to the above-described physical degradation mechanisms.

The monitor 200 includes a reference ring 202. The reference ring 202 is a ring oscillator of known length that has power applied to it only during testing. This preserves the properties of the reference ring 202 relative to the test rings 204, which are always powered on. The use of a reference ring 202 provides a consistent standard for comparison as the test rings 204 degrade under stress. The reference ring 202 has an associated reference counter that increments, e.g., every time the reference ring 202 completes a full oscillation. The reference counter is enabled only for a short time, sufficient to achieve the needed frequency resolution.

The test rings 204 are each configured to react differently to the stresses of operation. As will be described in greater detail below, the test rings 204 may vary according to, e.g., frequency, device channel length, and capacitive load. Each of the test rings 204 has a respective test ring counter 208 that increments, e.g., every time its associated test ring 204 completes a full oscillation. The test counter is enabled for the same amount of time that the reference counter is enabled An analysis module 210 considers the counts provided by the reference counter 206 and the test ring counters 208 to determine a level of degradation due to both BTI and HCI effects. The analysis module 210 may perform one or more of the following test analyses, using multiple different test rings 204 to provide multiple data points on which to base the analysis. In addition, because HCI is influenced by multiple physical characteristics, the analysis module 210 is capable of performing analysis according to specific device types on the chip according to their particular configuration and load. In each case, a measurement of the total degradation of the devices is made by comparing the various test rings 204 to the reference ring 202, which maintains the properties of devices from shortly after fabrication.

Figure 3:
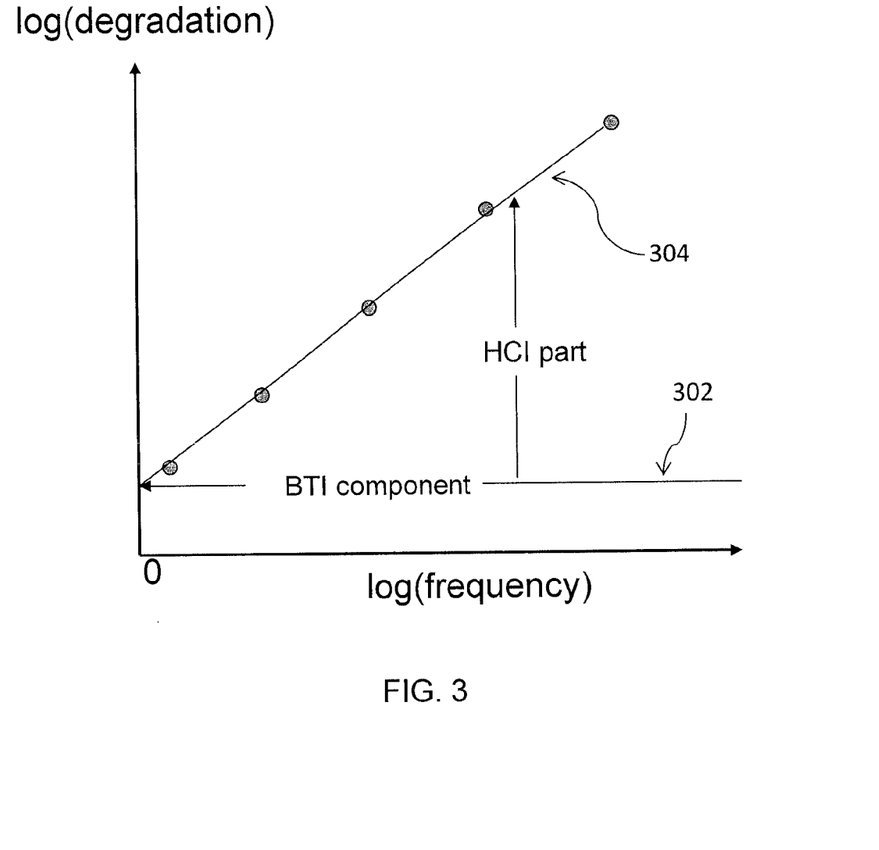
FIG. 3 is a diagram of the relationship between frequency and degradation in accordance with the present principles.

Referring now to FIG. 3, a relationship between HCI degradation and switching frequency is shown. HCI degradation occurs when a device changes state, while BTI depends on total power-on time. The vertical axis of the graph shows the logarithm of device degradation while the horizontal axis shows the logarithm of frequency. As can be seen, the BTI degradation curve 302 is flat, that is, independent of frequency. Each data point shown represents a test ring 204 having a different frequency, which may be controlled by changing the number of devices in the oscillator—a larger number of devices will correspond to a lower frequency, as it takes longer for the signal to cycle through the entire ring. Each of the test rings 204 is tested after a fixed time interval and their degradation level is plotted to create degradation curve 304.

The analysis module 210 extrapolates according to HCI degradation as a function of time and frequency (providing a number of device switches) to determine the HCI and BTI components of degradation. The BTI component of the degradation will represent the degradation value at a frequency of zero, while the HCI component will be the difference between the curve and the BTI component.

Figure 4:
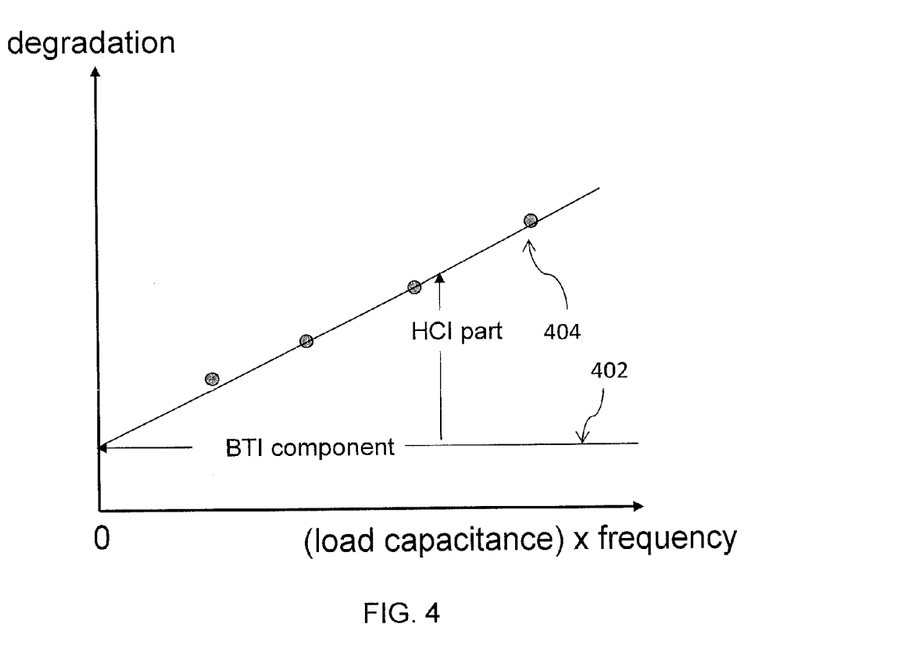
FIG. 4 is a diagram of the relationship between load capacitance, frequency, and degradation in accordance with the present principles.

Referring now to FIG. 4, a relationship between HCI degradation and device capacitance is shown. HCI depends on current in the channel. Using ring oscillators having differing capacitive loads provides different switching currents. The vertical axis again shows measured degradation, while the horizontal axis now shows the product of load capacitance with frequency. As BTI is again insensitive to the current in the channel of the device, the BTI component 402 of the degradation depends only on the amount of time a device is powered on. Measuring several different test rings 204 after running a fixed amount of time allows the analysis module 210 to analyze the degradation of the different test rings 204, to extrapolate to a capacitance-and-frequency of zero, to determine the BTI component of degradation, and thereby to determine the HCI component of degradation by subtracting the BTI degradation value 402 from the total degradation curve 404.

Figure 5:
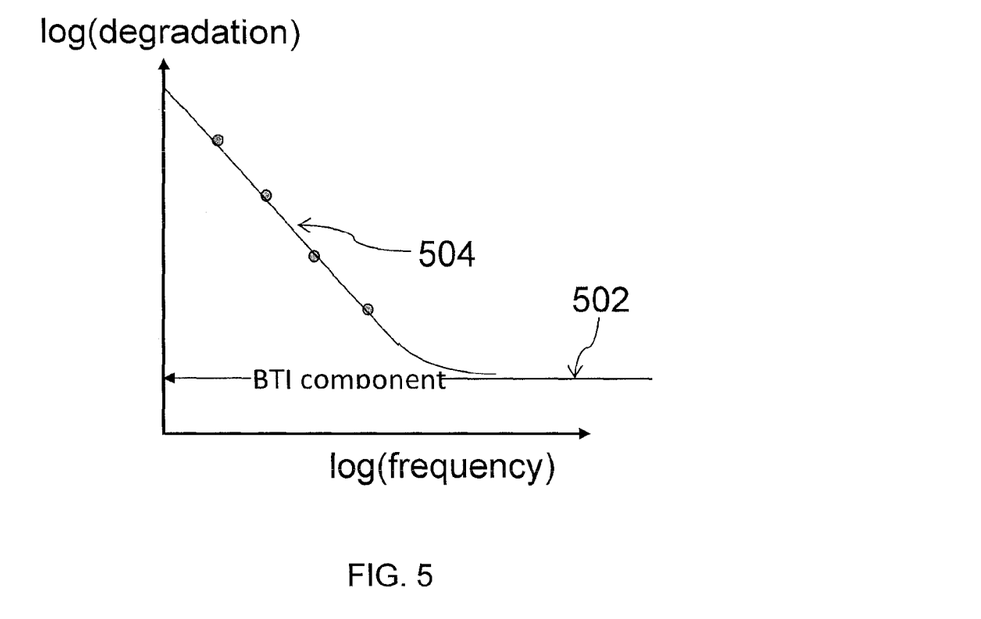
FIG. 5 is a diagram of the relationship between frequency and degradation for varying device channel lengths in accordance with the present principles.

Referring now to FIG. 5, a relationship between HCI degradation and device channel length is shown. HCI depends on channel length, with shorter channel lengths producing larger amounts of HCI degradation. The vertical axis shown is the logarithm of degradation, while the horizontal axis is the logarithm of the channel length.

In the case of measuring degradation based on channel length, the BTI component 502 is determined by measuring values of the total degradation curve 504 at higher channel lengths until the curve 504 approaches some asymptote representing the BTI degradation value 502. Using the BTI degradation value 502, the analysis module 210 can determine the HCI component of degradation by subtracting the BTI value 502 from the total degradation curve 504.

Figure 6:
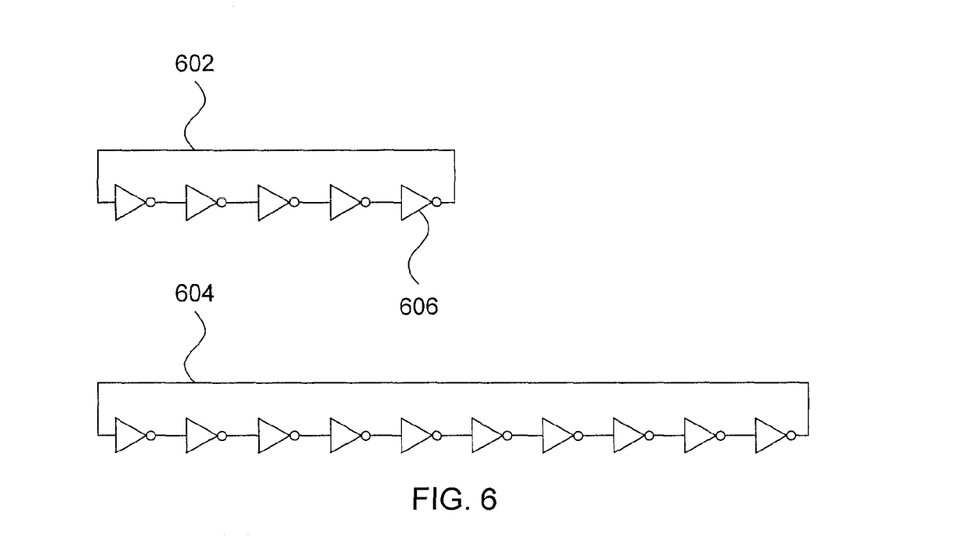
FIG. 6 is a diagram of test ring oscillators varying by frequency or by channel length in accordance with the present principles.

Referring now to FIG. 6, a diagram of two ring oscillators is shown. For devices that have a common channel length, a first test ring 602 has a higher frequency than a second test ring 604. In this case the rings are formed from a series of inverters 606, each of which inverts its input signal, providing a logical "not" operation. A delay is introduced at each device 606, as it takes time for the signal to propagate through the device, with the period of one ring oscillation being twice the sum of the delays for each of the constituent devices 606. Other devices, such as NANDs and NORs, or a combination of them, can be used to construct the ring oscillator.

In an alternative embodiment, the first ring 602 and the second ring 604 may have the same frequency if the devices 606 of the second ring 604 have a shorter channel length than the devices 606 of the first ring 602. The shorter channel length results in a shorter delay. Additional rings may be used with different lengths to provide sufficient data points for analysis.

Figure 7:
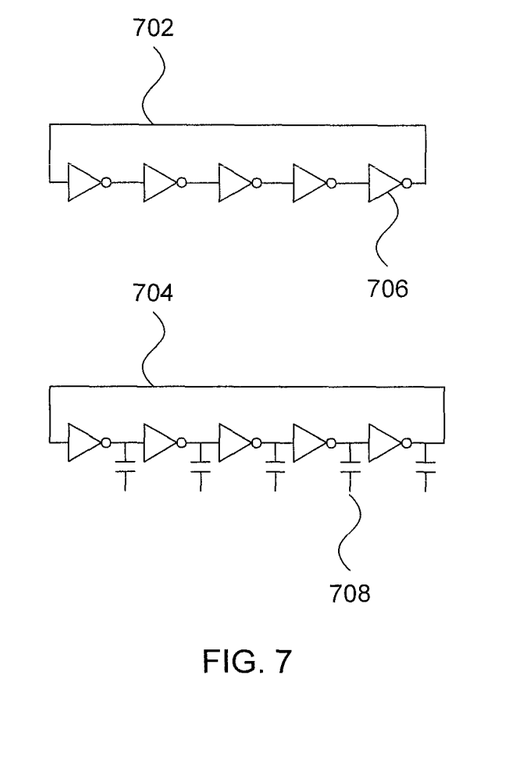
FIG. 7 is a diagram of test ring oscillators varying by capacitive load in accordance with the present principles.

Referring now to FIG. 7, a diagram of two ring oscillators having different capacitive loads is shown. The first ring oscillator 702 has a set of inverters 706 that represents a first capacitive load. The second ring oscillator 704 has inverters 706 that are interspersed by capacitors 708 that change the capacitive load. This affects the switching current in the devices 706 and thereby affects the HCI degradation in the devices 706. It should be noted that the different capacitive loads 708 need not be the same—all loads may be equal or an extra load may be present on only some stages of the second ring oscillator 704. Additional ring oscillators may also be used having different capacitive loads to provide sufficient data points for analysis.

Figure 8:
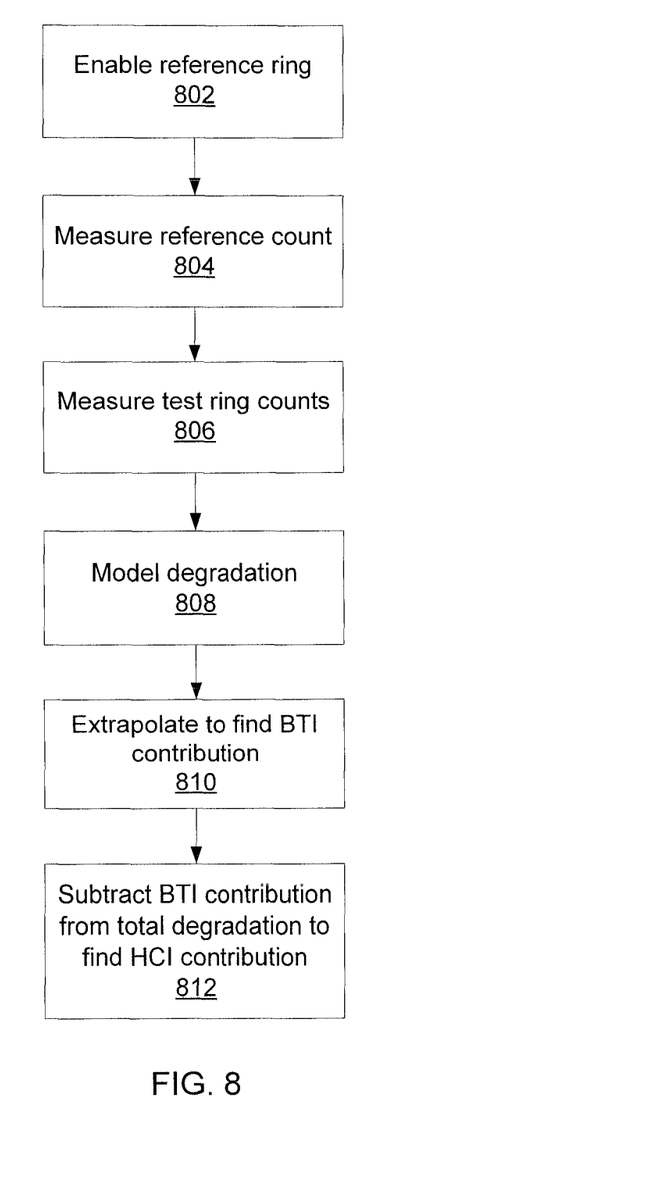
FIG. 8 is a block/flow diagram of degradation analysis in accordance with the present principles.

Referring now to FIG. 8, a method of measuring degradation is shown. At the initiation of testing, block 802 enables the reference ring 202, which is normally left unpowered while the test rings 204 operate continuously.

After a set period of time, block 804 measures the reference count 206 and block 806 measures the test ring count 208 for each test ring 204. The test ring counts 208 provide frequency measurements which, when compared to a frequency measurement from the un-degraded reference ring 202, provides a measurement of total degradation for each test ring 204.

Block 808 models the degradation by, e.g., plotting points for each test ring 204 with the measurements of total degradation for the test ring 204 against the quantity that is varied across the test rings 204 (e.g., frequency, channel length, channel current, etc.). Block 808 uses an expected functional form of the combined degradation to match the points to a model. Block 810 uses the model to extrapolate to a point of low expected HCI and uses that value as the BTI contribution to the total degradation. Block 812 then subtracts the BTI contribution from the modeled degradation value at a given quantity to determine the HCI degradation for matching devices. For example, following the model of FIG. 3 for degradation as a function of frequency, a frequency for an on-chip device is used to obtain a specific HCI degradation value.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 9:
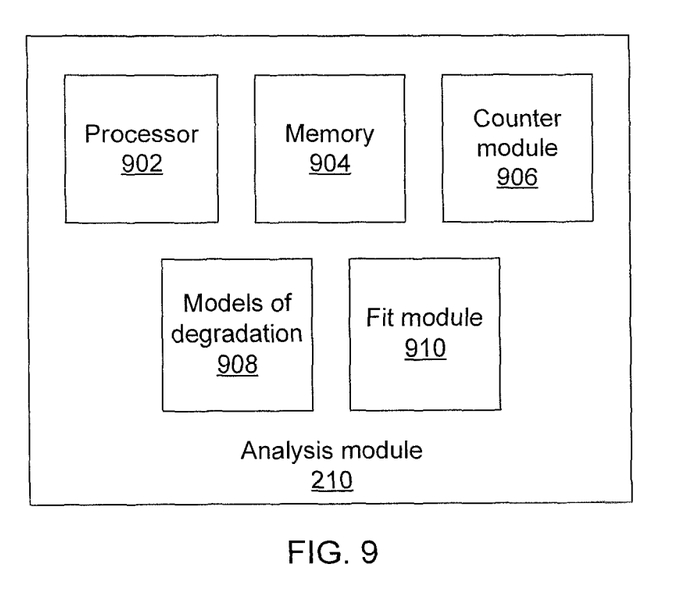
FIG. 9 is a block diagram of a degradation analysis system in accordance with the present principles.

Referring now to FIG. 9, a block diagram of analysis module 210 is shown. It should be recognized that the analysis module 210 can be formed integrally on-chip or can be implemented off-chip and accept the data from some intermediary. The analysis module 210 includes a processor 902 and a memory 904. A counter module 906 receives counts from the reference counter 206 and test ring counters to determine frequencies and other timing information for the respective ring oscillators. This information is stored in the memory 904. The memory 904 also stores one or more models of degradation that provide functional relationships between degradation and one or more quantities such as, e.g., frequency, channel length, and capacitive load. The fit module 910 then uses processor 902 to fit the timing measurements to the stored degradation models 908 to determine BTI and HCI contributions to the total degradation.

Having described preferred embodiments of a system and method for on-chip combined hot carrier injection and bias temperature instability monitoring (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for monitoring circuit degradation, comprising:
    measuring degradation in a plurality of on-chip test oscillators that vary according to a quantity that influences hot carrier injection (HCI) degradation;
    extrapolating from the measured degradation for the plurality of test oscillators to determine a bias temperature instability (BTI) contribution to the measured degradation;
    subtracting the BTI contribution from the measured degradation at a predetermined value of the quantity to determine the HCI degradation for devices represented by the predetermined value.

2. The method of claim 1, wherein the plurality of test oscillators vary according to oscillator frequency.

3. The method of claim 2, wherein each test oscillator comprises a different number of inverters to provide a respective oscillator frequency.

4. The method of claim 1, wherein the plurality of test oscillators vary according to capacitive load.

5. The method of claim 4, wherein each test oscillator comprises a same number of inverters interspersed by a respective capacitive load.

6. The method of claim 1, wherein the plurality of test oscillators vary according to channel length.

7. The method of claim 6, wherein each test oscillator comprises a different number of inverters, with the inverters of each respective test oscillator having a different channel length, such that each of the plurality of test oscillators have a same frequency.

8. The method of claim 1, wherein measuring degradation in the plurality of test oscillators comprises:
    measuring first frequency information for the plurality of test oscillators;
    measuring second frequency information for a reference oscillator;
    comparing the first frequency information to the second timing information to determine a level of degradation for each of the plurality of test oscillators.

9. A system for monitoring circuit degradation, comprising:
    a counter module configured to collect timing information from a plurality of on-chip test oscillators that vary according to a quantity that influences hot carrier injection (HCI) degradation; and
    a fit module configured to determine a measurement of degradation for each test oscillator based on the timing information, to extrapolate from the measured degradation for the plurality of test oscillators to determine a bias temperature instability (BTI) contribution to the measured degradation, and to subtract the BTI contribution from the measured degradation at a predetermined value of the quantity to determine the HCI degradation for devices represented by the predetermined value.

10. The system of claim 9, wherein the plurality of test oscillators vary according to oscillator frequency.

11. The system of claim 10, wherein each test oscillator comprises a different number of inverters to provide a respective oscillator frequency.

12. The system of claim 9, wherein the plurality of test oscillators vary according to capacitive load.

13. The system of claim 12, wherein each test oscillator comprises a same number of inverters interspersed by different capacitive loads.

14. The system of claim 9, wherein the plurality of test oscillators vary according to channel length.

15. The system of claim 14, wherein each test oscillator comprises a different number of inverters, with the inverters of each respective test oscillator having a different channel length, such that each of the plurality of test oscillators have a same frequency.

16. The system of claim 9, wherein the counter module is further configured to collect frequency information from a reference oscillator and wherein the fit module is configured to determine a measurement of degradation by comparing the frequency information from the plurality of test oscillators to the frequency information for the reference oscillator to determine a level of degradation for each of the plurality of test oscillators.

17. An on-chip test circuit, comprising:
a reference oscillator that is powered on only during tests;
a plurality of test oscillators that vary according to a quantity that influences hot carrier injection (HCI) degradation;
a reference counter that provides timing information for the reference oscillator; and
a plurality of test counters that each provide timing information for a respective test ring oscillator.

18. The on-chip test circuit of claim 17, wherein the plurality of test oscillators vary according to frequency and each test oscillator comprises a different number of inverters to provide a respective oscillator frequency.

19. The on-chip test circuit of claim 17, wherein the plurality of test oscillators vary according to capacitive load and each test oscillator comprises a same number of inverters interspersed by a respective capacitive load.

20. The on-chip test circuit of claim 17, wherein the plurality of test oscillators vary according to channel length and each test oscillator comprises a different number of inverters, with the inverters of each respective test oscillator having a different channel length, such that the plurality of test oscillators have a same frequency.

* * * * *